(12) United States Patent
Imamura

(10) Patent No.: US 12,740,416 B2
(45) Date of Patent: Sep. 15, 2026

(54) CIRCUIT BOARD, IMAGE FORMING APPARATUS, MOUNTING METHOD ONTO CIRCUIT BOARD, AND METHOD OF MANUFACTURING PLURALITY OF IMAGE FORMING APPARATUS

(71) Applicant: CANON KABUSHIKI KAISHA, Tokyo (JP)

(72) Inventor: Takeru Imamura, Chiba (JP)

(73) Assignee: CANON KABUSHIKI KAISHA, Tokyo (JP)

(*) Notice: Subject to any disclaimer, the term of this patent is extended or adjusted under 35 U.S.C. 154(b) by 475 days.

(21) Appl. No.: 18/472,541

(22) Filed: Sep. 22, 2023

(65) Prior Publication Data

US 2024/0105643 A1 Mar. 28, 2024

(30) Foreign Application Priority Data

Sep. 28, 2022 (JP) ................................ 2022-154442

(51) Int. Cl.
*H04N 1/23* (2006.01)
*H10W 42/00* (2026.01)
*H10W 72/00* (2026.01)
*H10W 72/90* (2026.01)

(52) U.S. Cl.
CPC .......... *H10W 42/00* (2026.01); *H04N 1/2307* (2013.01); *H10W 72/00* (2026.01); *H10W 72/927* (2026.01)

(58) Field of Classification Search
CPC ........ H04N 1/2307; H04N 1/23; H05K 1/029; H05K 1/0295; H05K 2201/10166; H05K 2201/10689; H10W 42/00; H10W 72/00; H10W 72/927
USPC .......................................................... 361/764
See application file for complete search history.

(56) References Cited

U.S. PATENT DOCUMENTS 12,436,396 B2* 10/2025 Takagi ............... G02B 27/0172
2014/0133075 A1* 5/2014 Hossain ................. H05K 1/111 361/679.02
2017/0228029 A1* 8/2017 Wexler ................... G05B 15/02
2022/0171201 A1* 6/2022 Takagi .............. G02B 27/0172
(Continued)

FOREIGN PATENT DOCUMENTS

JP 2002-299900 11/2002
JP 2012-8763 A 1/2012

OTHER PUBLICATIONS

Japanese Office Action issued May 12, 2026 during prosecution of corresponding Japanese Application No. 2022-154442. (English language machine translation included).

*Primary Examiner* — Timothy J Thompson
*Assistant Examiner* — Guillermo J Egoavil
(74) *Attorney, Agent, or Firm* — VENABLE LLP

(57) ABSTRACT

A circuit board on which a first semiconductor device or a second semiconductor device which is different from the first semiconductor device is exclusively mounted, wherein the circuit board comprises a region in which a component configured to form a circuit for achieving a function incorporated in the first semiconductor device but not incorporated in the second semiconductor device is to be mounted, and wherein the component is prevented from being mounted in the region in a case where the first semiconductor device is mounted, and the component is mounted in the region in a case where the second semiconductor device is mounted.

10 Claims, 7 Drawing Sheets

| COMPONENT | IC1 | IC2 |
|---|---|---|
| Css | MOUNTED | UNMOUNTED |
| Rpg | UNMOUNTED | MOUNTED |
| IC3 | MOUNTED | UNMOUNTED |
| Cin3 | MOUNTED | UNMOUNTED |
| Cd | MOUNTED | UNMOUNTED |
| Rout | MOUNTED | UNMOUNTED |

(56) References Cited

U.S. PATENT DOCUMENTS

| | | | | |
|---|---|---|---|---|
| 2022/0331047 | A1* | 10/2022 | Shelton, IV | G06T 11/00 |
| 2023/0176612 | A1* | 6/2023 | Tyagi | G06F 1/1616 |
| 2023/0275625 | A1* | 8/2023 | Kim | H01Q 1/22 455/73 |

* cited by examiner

| COMPONENT | IC1 | IC2 |
|---|---|---|
| Css | MOUNTED | UNMOUNTED |
| Rpg | UNMOUNTED | MOUNTED |
| IC3 | MOUNTED | UNMOUNTED |
| Cin3 | MOUNTED | UNMOUNTED |
| Cd | MOUNTED | UNMOUNTED |
| Rout | MOUNTED | UNMOUNTED |

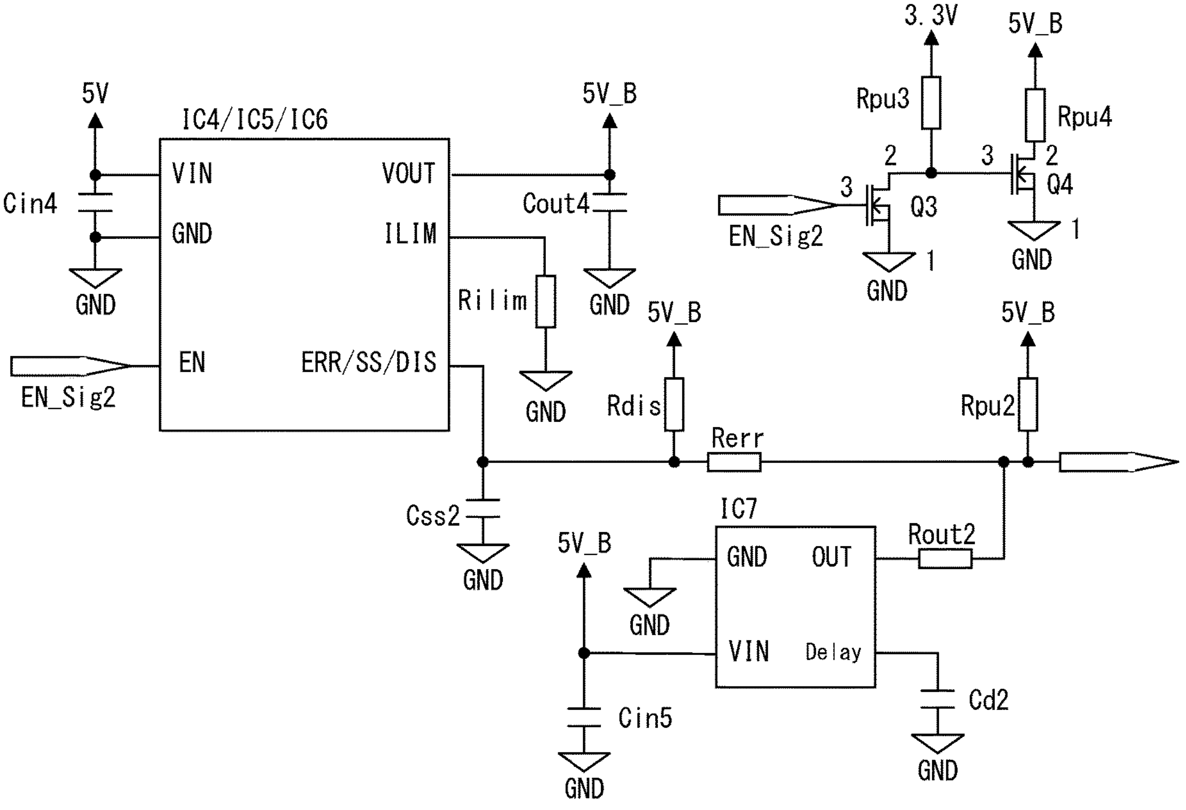

FIG. 6A

| COMPONENT | IC4 | IC5 | IC6 |
|---|---|---|---|
| Rerr | MOUNTED | UNMOUNTED | UNMOUNTED |
| Rdis | UNMOUNTED | UNMOUNTED | MOUNTED |
| Css2 | UNMOUNTED | MOUNTED | UNMOUNTED |
| Q3 | MOUNTED | MOUNTED | UNMOUNTED |
| Rpu3 | MOUNTED | MOUNTED | UNMOUNTED |
| Q4 | MOUNTED | MOUNTED | UNMOUNTED |
| Rpu4 | MOUNTED | MOUNTED | UNMOUNTED |
| IC7 | UNMOUNTED | MOUNTED | MOUNTED |
| Cin5 | UNMOUNTED | MOUNTED | MOUNTED |
| Cd2 | UNMOUNTED | MOUNTED | MOUNTED |
| Rout2 | UNMOUNTED | MOUNTED | MOUNTED |

FIG. 6B

FIG. 7A
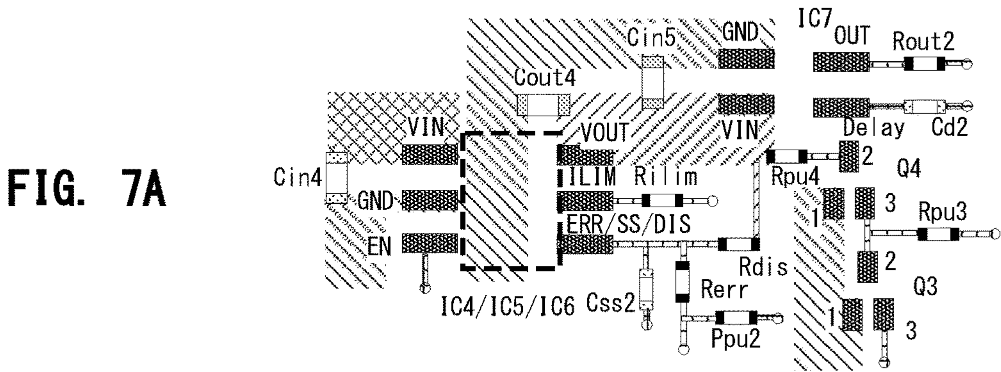
FIG. 7B
Cout4
Rpu4
Cin4
Rilim
Q4
IC4
Rpu3
Rerr
Q3
Rpu2
FIG. 7C
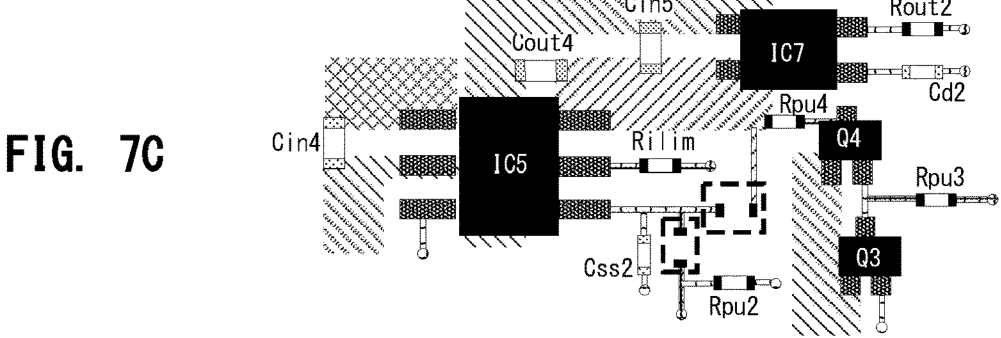
FIG. 7D
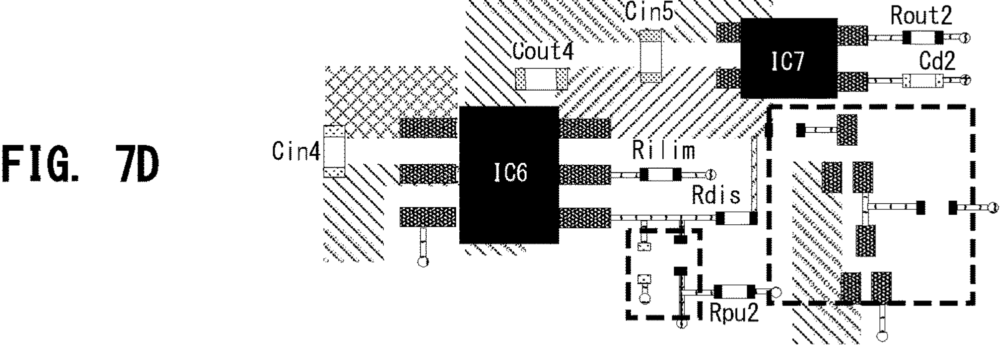

CIRCUIT BOARD, IMAGE FORMING APPARATUS, MOUNTING METHOD ONTO CIRCUIT BOARD, AND METHOD OF MANUFACTURING PLURALITY OF IMAGE FORMING APPARATUS

BACKGROUND OF THE INVENTION

Field of the Invention

The present disclosure relates to a circuit board on which an electronic component for operating various constituent components built into an apparatus is to be mounted, an image forming apparatus, such as a printer, a copying machine, or a multifunctional peripheral, which includes the circuit board, a mounting method onto circuit board, and a method of manufacturing plurality of image forming apparatus.

Description of the Related Art

An image forming apparatus includes a plurality of circuit boards for control, which are used for control of image formation. The circuit boards for control include a circuit board having a function of performing control of image processing, a circuit board having a function of performing control of paper conveyance, and the like. Each of the circuit boards for control has formed therein a plurality of circuits, such as a logic circuit, a drive circuit, and a power supply circuit, in accordance with the function to be achieved. Accordingly, a large number of electronic components are procured and mounted on the circuit board for control.

Procurement of electronic components is sometimes difficult for various reasons. Accordingly, for each electronic component to be mounted on the circuit board for control, it is required to make research in advance for a replacement component having the same or similar shape and specification. When a problem occurs in the procurement of the electronic component, the electronic component may be promptly changed to the replacement component so that the production of the circuit board for control is continued. In Japanese Patent Application Laid-open No. 2002-299900, there is disclosed an external appearance inspection method for a component mounted on a circuit board. In Japanese Patent Application Laid-open No. 2002-299900, there is proposed a mounted component inspection method which does not require replacement of component inspection data in a case where a plurality of types of components having the same characteristic but different external appearances are mounted at the same positions on a plurality of boards, respectively.

Electronic components to be used in electronic equipment, such as information processing apparatus such as a personal computer, or an image forming apparatus, have a small number of electronic components having the same or similar shapes and specifications. Accordingly, selection of a replaceable component is difficult. For example, a power supply integrated circuit (IC) for supplying power to an electronic component is an example of an electronic component for which selection of a replacement component is difficult. As power supply ICs, there are a DC-DC converter, a high-side switch, a load switch, and the like. In many cases, terminal functions and electrical specifications are not similar.

Accordingly, it is difficult to substitute only the power supply IC with the replacement component for use at the time of mounting components onto the circuit board. In order to flexibly cope with the problem to be caused by the procurability, it is more realistic not to achieve the required function by one electronic component, but to achieve the required function by a plurality of electronic components. However, in a case where a plurality of components are used for replacement, there arise problems of a wiring pattern and downsizing of a circuit scale. In view of the above-mentioned problems, the present disclosure has an object to provide a circuit board which can be downsized even when a function that is different among ICs of different types is compensated for by a plurality of components.

SUMMARY OF THE INVENTION

A circuit board on which a first semiconductor device or a second semiconductor device which is different from the first semiconductor device is exclusively mounted according to the present disclosure includes a region in which a component configured to form a circuit for achieving a function incorporated in the first semiconductor device but not incorporated in the second semiconductor device is to be mounted, and the component is prevented from being mounted in the region in a case where the first semiconductor device is mounted, and the component is mounted in the region in a case where the second semiconductor device is mounted.

Further, an image forming apparatus according to the present disclosure includes a constituent component for use in forming an image, and a circuit board which is connected to the constituent component, and on which a first semiconductor device or a second semiconductor device which is different from the first semiconductor device is exclusively mounted, wherein the circuit board includes a region in which a component configured to form a circuit for achieving a function incorporated in the first semiconductor device but not incorporated in the second semiconductor device is to be mounted, and wherein the component is prevented from being mounted in the region in a case where the first semiconductor device is mounted, and the component is mounted in the region in a case where the second semiconductor device is mounted.

Furthermore, a mounting method, according to the present disclosure, onto a circuit board on which a first semiconductor device or a second semiconductor device which is different from the first semiconductor device is exclusively mountable, the circuit board having a region in which a component for use in achieving a function incorporated in the first semiconductor device but not incorporated in the second semiconductor device is to be mounted, includes preventing the component from being mounted in the region in a case where the first semiconductor device is mounted, and mounting the component in the region in a case where the second semiconductor device is mounted.

Furthermore, a method of manufacturing a plurality of image forming apparatus according to the present disclosure includes preparing a first image forming apparatus including a first circuit board, preparing a second image forming apparatus including a second circuit board, arranging, on the first circuit board, a first semiconductor device configured to execute a first function and a second function, and arranging, on the second circuit board, a second semiconductor device configured to execute the first function and a component configured to form a circuit configured to execute the second function, wherein the first circuit board further includes a region in which the second semiconductor device of the second image forming apparatus is arrangeable, and a region in which the component of the second image forming apparatus is arrangeable, and wherein the second circuit board further includes a region in which the first semiconductor device of the first image forming apparatus is arrangeable.

Further features of the present invention will become apparent from the following description of exemplary embodiments (with reference to the attached drawings).

BRIEF DESCRIPTION OF THE DRAWINGS

FIG. 6A and FIG. 6B are explanatory diagrams of a circuit board on which a power switch IC is to be mounted.

FIG. 7A, FIG. 7B, FIG. 7C, and FIG. 7D are exemplary views of circuit layouts of the circuit board of FIG. 6A and FIG. 6B.

DESCRIPTION OF THE EMBODIMENTS

Now, an embodiment of the present disclosure is described with reference to the drawings. A configuration and a circuit of an apparatus described in this embodiment are merely examples for describing proposed contents, and the present disclosure is not limited to the contents described herein.

<Image Forming System>

Figure 1:
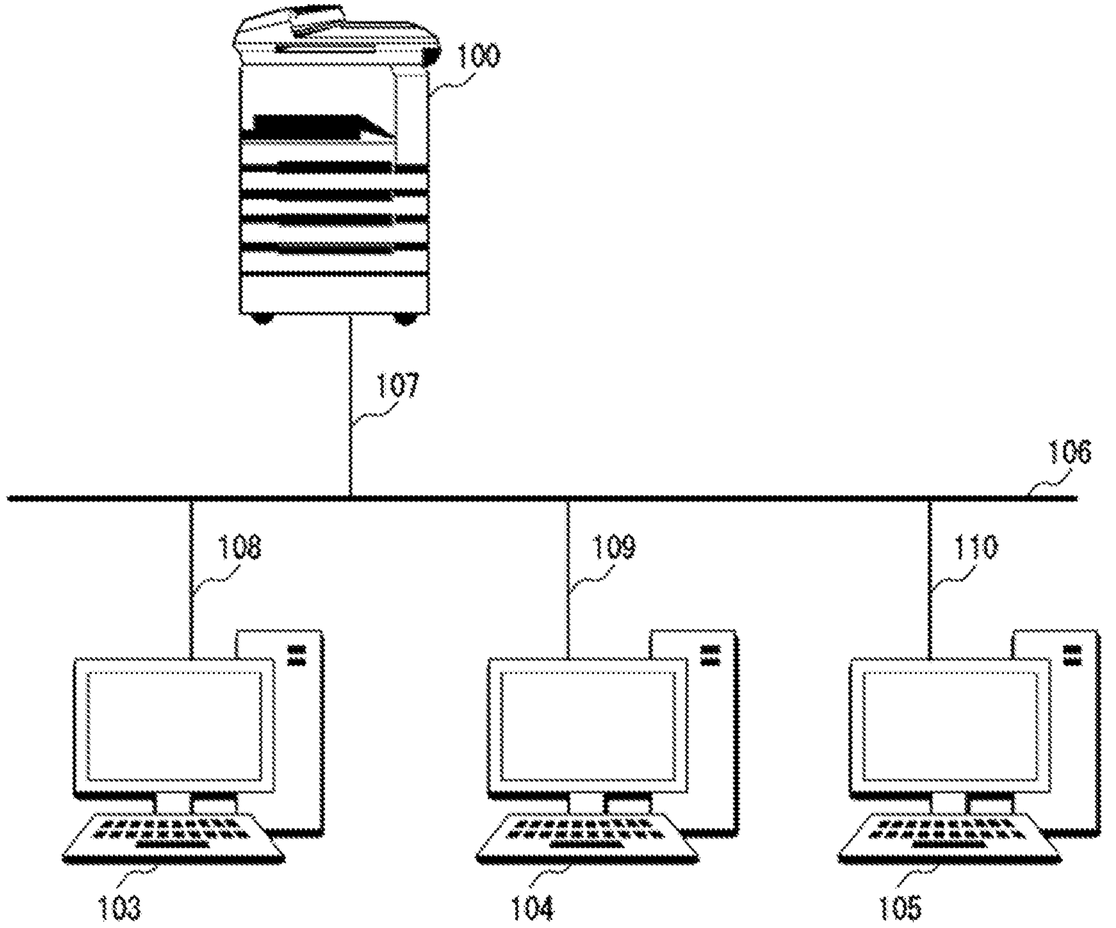
FIG. 1 is a configuration view of an image forming system.

FIG. 1 is a configuration view of an image forming system in which an image forming apparatus according to this embodiment is connected to personal computers for performing image processing. In this embodiment, description is given through use of an image forming apparatus 100 as an example of electronic equipment, but the electronic equipment may be an information processing apparatus, such as a personal computer or a server, or general electrical equipment, such as an air conditioner or a refrigerator.

This image forming system is configured such that the image forming apparatus 100 and each of a plurality of personal computers 103 to 105 are connected to each other so that mutual communication is allowed therebetween via a network 106. The image forming apparatus 100 is connected to the network 106 via a network cable 107. The personal computer 103 is connected to the network 106 via a network cable 108. The personal computer 104 is connected to the network 106 via a network cable 109. The personal computer 105 is connected to the network 106 via a network cable 110. The network 106 is, for example, a local area network (LAN). A plurality of image forming apparatus 100 may be connected to the network 106. Further, the image forming apparatus 100 and the plurality of personal computers 103 to 105 may be connected wirelessly without using the network cables 107 to 110.

When the image forming apparatus 100 acquires a print job from the personal computers 103 to 105 via the network 106, the image forming apparatus 100 performs image forming processing in accordance with the print job. A user can shut down the image forming apparatus 100 by giving an instruction of remote shutdown from the personal computers 103 to 105 via the network 106.

<Image Forming Apparatus>

Figure 2:
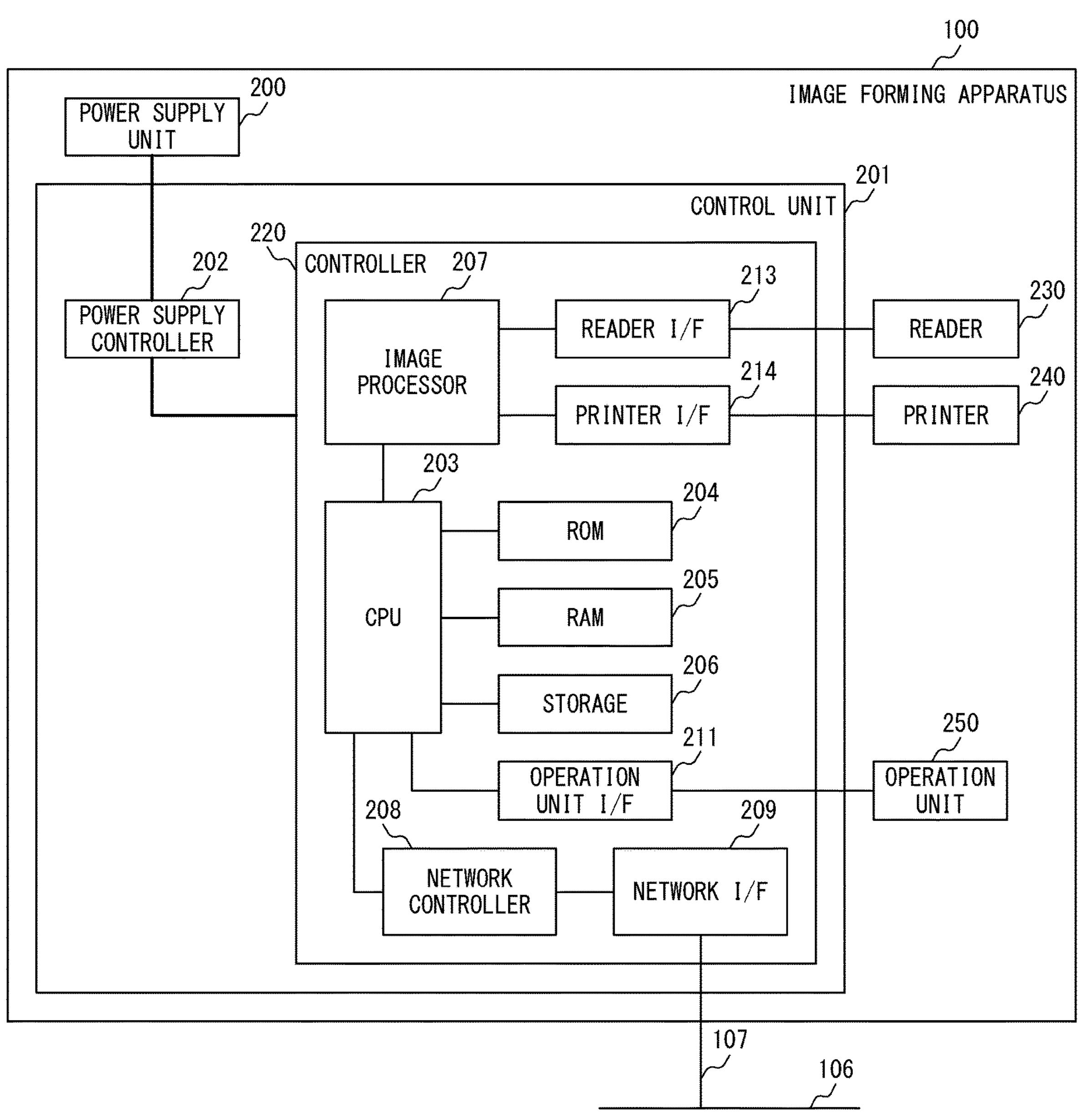
FIG. 2 is a configuration diagram of an image forming apparatus.

FIG. 2 is a configuration diagram of the image forming apparatus 100. The image forming apparatus 100 includes a power supply unit 200, a control unit 201, a reader 230, a printer 240, and an operation unit 250. The control unit 201 includes a power supply controller 202 and a controller 220. The controller 220 includes a central processing unit (CPU) 203, a read only memory (ROM) 204, a random access memory (RAM) 205, and a storage 206. The controller 220 further includes an image processor 207, a network controller 208, a network interface (I/F) 209, an operation unit I/F 211, a reader I/F 213, and a printer I/F 214.

The power supply unit 200 supplies power to each of constituent components included in the image forming apparatus 100. The power supply controller 202 controls the power supply unit 200 so as to control supply of power to each of the constituent components included in the image forming apparatus 100. The power supply controller 202 causes the power supply unit 200 to supply power to each of the constituent components in a case where an operation mode is shifted from a power saving mode to a normal mode or in a case where an instruction is given from a user through switch operation or the like.

The CPU 203 executes a computer program stored in the ROM 204 and the storage 206 so as to control the operation of the entire image forming apparatus 100. The ROM 204 stores an activation program, various setting values, and the like. The RAM 205 provides a work area to be used in a case where the CPU 203 executes processing, and stores temporary data and the like. The storage 206 is a bulk storage, such as a hard disk drive (HDD) or a solid state drive (SSD), and is used for storing of a control program of the image forming apparatus 100 or temporary saving of image data.

The storage 206 is connected to the CPU 203 through, for example, serial advanced technology attachment (ATA). A plurality of storages 206 may be connected to the CPU 203. The CPU 203 may perform control such as RAID 0 (striping) or RAID 1 (mirroring) on the storage 206. The CPU 203 writes or reads out data into or from the storage 206.

The CPU 203 is connected to the image processor 207. The image processor 207 is connected to the reader 230 via the reader I/F 213, and is connected to the printer 240 via the printer I/F 214. The CPU 203 controls operations of the reader 230 and the printer 240 directly or via the image processor 207.

The reader 230 includes an automatic document feeder (ADF) and a scanner unit, and reads an image from an original placed on a platen or the ADF. The reader 230 generates image data from the read image, and transmits the image data to the image processor 207 via the reader I/F 213. The image processor 207 performs image processing such as color space conversion on the image data acquired from the reader 230 or image data acquired from the storage 206 via the CPU 203. The image processor 207 transmits the image data that has been subjected to image processing to the printer 240 via the printer I/F 214. The printer 240 prints, on a sheet, an image corresponding to the image data acquired from the image processor 207.

The network controller 208 is connected to the network cable 107 via the network I/F 209. The network controller 208 performs communication to/from the personal computers 103 to 105 so as to acquire a print job or the like and transmit the acquired print job or the like to the CPU 203.

The operation unit 250 is a user interface including an input interface and an output interface. Examples of the input interface include various key buttons and a touch panel. Examples of the output interface include a display and a speaker. The operation unit 250 can communicate to/from the CPU 203 via the operation unit I/F 211. The operation unit 250 inputs an instruction of, for example, copy, scan, print, or shift to the power saving mode, which has been received by the input interface from a user, to the CPU 203 via the operation unit I/F 211. The operation unit 250 displays various screens on a display based on an instruction from the CPU 203.

<Power Supply System>

Figure 3:
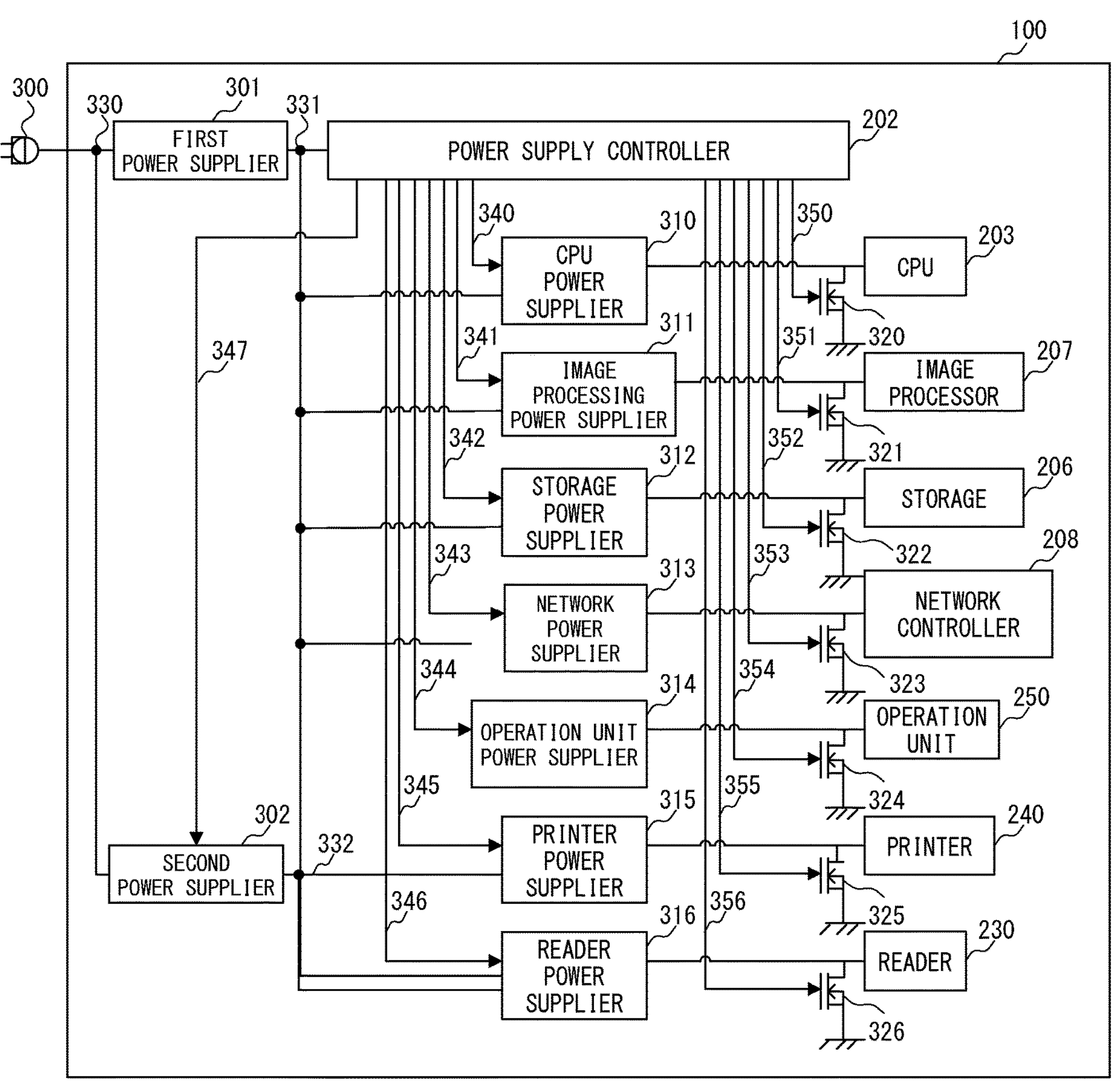
FIG. 3 is an explanatory diagram of a power supply system of the image forming apparatus.

FIG. 3 is an explanatory diagram of a power supply system of the image forming apparatus 100. The power supply unit 200 of FIG. 2 includes a first power supplier 301 and a second power supplier 302. The power supply controller 202 includes a CPU power supplier 310, an image processing power supplier 311, a storage power supplier 312, a network power supplier 313, and an operation unit power supplier 314. The printer 240 includes a printer power supplier 315. The reader 230 includes a reader power supplier 316. There may be employed a configuration in which the power supply unit 200 includes each power supplier, but a required voltage is different in each block, and hence it is more preferred to employ a configuration in which, as illustrated in FIG. 3, a unit to be used has each power supplier.

The first power supplier 301 and the second power supplier 302 are supplied with power 330 from an external power supply 300. The first power supplier 301 provides power 331 obtained by converting the power 330 to each of the power supply controller 202, the CPU power supplier 310, the image processing power supplier 311, the storage power supplier 312, the network power supplier 313, and the operation unit power supplier 314. The first power supplier 301 converts the power 330 to have a power value (voltage) corresponding to a supply destination, and provides the power 331 of each supply destination. The second power supplier 302 provides power 332 obtained by converting the power 330 to each of the printer power supplier 315 and the reader power supplier 316. The second power supplier 302 converts the power 330 to have a power value (voltage) corresponding to a supply destination, and provides the power 332 of each supply destination.

The power supply controller 202 transmits control signals 340 to 347 to the second power supplier 302, the CPU power supplier 310, the image processing power supplier 311, the storage power supplier 312, the network power supplier 313, the operation unit power supplier 314, the printer power supplier 315, and the reader power supplier 316. The second power supplier 302, the CPU power supplier 310, the image processing power supplier 311, the storage power supplier 312, the network power supplier 313, the operation unit power supplier 314, the printer power supplier 315, and the reader power supplier 316 are controlled to be turned on or off by the control signals 340 to 347. Through control performed by the power supply controller 202, each of the second power supplier 302, the CPU power supplier 310, the image processing power supplier 311, the storage power supplier 312, the network power supplier 313, the operation unit power supplier 314, the printer power supplier 315, and the reader power supplier 316 is supplied with power only when required.

The CPU power supplier 310 supplies power to the CPU 203. A circuit 320 for charge extraction is connected to a wiring line for supplying power from the CPU power supplier 310 to the CPU 203. FIG. 3 shows only a transistor as the circuit 320 for charge extraction, but the circuit 320 for charge extraction adjusts a current value through use of a resistor depending on the standard of the CPU power supplier 310. The circuit 320 for charge extraction is controlled to be turned on or off by a control signal 350 input from the power supply controller 202.

When power is supplied from the CPU power supplier 310 to the CPU 203, the CPU power supplier 310 is controlled to be turned on by the control signal 340, and the circuit 320 for charge extraction is controlled to be turned off by the control signal 350. When no power is supplied from the CPU power supplier 310 to the CPU 203, the CPU power supplier 310 is controlled to be turned off by the control signal 340, and the circuit 320 for charge extraction is controlled to be turned on by the control signal 350. When the circuit 320 for charge extraction is turned on, the wiring line for supplying power from the CPU power supplier 310 to the CPU 203 is grounded so as to discharge charges.

The image processing power supplier 311 supplies power to the image processor 207. A circuit 321 for charge extraction is connected to a wiring line for supplying power from the image processing power supplier 311 to the image processor 207. Similarly to the circuit 320 for charge extraction, the circuit 321 for charge extraction adjusts a current value through use of a resistor depending on the standard of the image processing power supplier 311. The circuit 321 for charge extraction is controlled to be turned on or off by a control signal 351 input from the power supply controller 202.

When power is supplied from the image processing power supplier 311 to the image processor 207, the image processing power supplier 311 is controlled to be turned on by the control signal 341, and the circuit 321 for charge extraction is controlled to be turned off by the control signal 351. When no power is supplied from the image processing power supplier 311 to the image processor 207, the image processing power supplier 311 is controlled to be turned off by the control signal 341, and the circuit 321 for charge extraction is controlled to be turned on by the control signal 351. When the circuit 321 for charge extraction is turned on, the wiring line for supplying power from the image processing power supplier 311 to the image processor 207 is grounded so as to discharge charges.

The storage power supplier 312 supplies power to the storage 206. A circuit 322 for charge extraction is connected to a wiring line for supplying power from the storage power supplier 312 to the storage 206. Similarly to the circuit 320 for charge extraction, the circuit 322 for charge extraction adjusts a current value through use of a resistor depending on the standard of the storage power supplier 312. The circuit 322 for charge extraction is controlled to be turned on or off by a control signal 352 input from the power supply controller 202.

When power is supplied from the storage power supplier 312 to the storage 206, the storage power supplier 312 is controlled to be turned on by the control signal 342, and the circuit 322 for charge extraction is controlled to be turned off by the control signal 352. When no power is supplied from the storage power supplier 312 to the storage 206, the storage power supplier 312 is controlled to be turned off by the control signal 342, and the circuit 322 for charge extraction is controlled to be turned on by the control signal 352. When the circuit 322 for charge extraction is turned on, the wiring line for supplying power from the storage power supplier 312 to the storage 206 is grounded so as to discharge charges.

The network power supplier 313 supplies power to the network controller 208. A circuit 323 for charge extraction is connected to a wiring line for supplying power from the network power supplier 313 to the network controller 208.

Similarly to the circuit 320 for charge extraction, the circuit 323 for charge extraction adjusts a current value through use of a resistor depending on the standard of the network power supplier 313. The circuit 323 for charge extraction is controlled to be turned on or off by a control signal 353 input from the power supply controller 202.

When power is supplied from the network power supplier 313 to the network controller 208, the network power supplier 313 is controlled to be turned on by the control signal 343, and the circuit 323 for charge extraction is controlled to be turned off by the control signal 353. When no power is supplied from the network power supplier 313 to the network controller 208, the network power supplier 313 is controlled to be turned off by the control signal 343, and the circuit 323 for charge extraction is controlled to be turned on by the control signal 353. When the circuit 323 for charge extraction is turned on, the wiring line for supplying power from the network power supplier 313 to the network controller 208 is grounded so as to discharge charges.

The operation unit power supplier 314 supplies power to the operation unit 250. A circuit 324 for charge extraction is connected to a wiring line for supplying power from the operation unit power supplier 314 to the operation unit 250. Similarly to the circuit 320 for charge extraction, the circuit 324 for charge extraction adjusts a current value through use of a resistor depending on the standard of the operation unit power supplier 314. The circuit 324 for charge extraction is controlled to be turned on or off by a control signal 354 input from the power supply controller 202.

When power is supplied from the operation unit power supplier 314 to the operation unit 250, the operation unit power supplier 314 is controlled to be turned on by the control signal 344, and the circuit 324 for charge extraction is controlled to be turned off by the control signal 354. When no power is supplied from the operation unit power supplier 314 to the operation unit 250, the operation unit power supplier 314 is controlled to be turned off by the control signal 344, and the circuit 324 for charge extraction is controlled to be turned on by the control signal 354. When the circuit 324 for charge extraction is turned on, the wiring line for supplying power from the operation unit power supplier 314 to the operation unit 250 is grounded so as to discharge charges.

The printer power supplier 315 supplies power to the printer 240. A circuit 325 for charge extraction is connected to a wiring line for supplying power from the printer power supplier 315 to the printer 240. Similarly to the circuit 320 for charge extraction, the circuit 325 for charge extraction adjusts a current value through use of a resistor depending on the standard of the printer power supplier 315. The circuit 325 for charge extraction is controlled to be turned on or off by a control signal 355 input from the power supply controller 202.

When power is supplied from the printer power supplier 315 to the printer 240, the printer power supplier 315 is controlled to be turned on by the control signal 345, and the circuit 325 for charge extraction is controlled to be turned off by the control signal 355. When no power is supplied from the printer power supplier 315 to the printer 240, the printer power supplier 315 is controlled to be turned off by the control signal 345, and the circuit 325 for charge extraction is controlled to be turned on by the control signal 355. When the circuit 325 for charge extraction is turned on, the wiring line for supplying power from the printer power supplier 315 to the printer 240 is grounded so as to discharge charges.

The reader power supplier 316 supplies power to the reader 230. A circuit 326 for charge extraction is connected to a wiring line for supplying power from the reader power supplier 316 to the reader 230. Similarly to the circuit 320 for charge extraction, the circuit 326 for charge extraction adjusts a current value through use of a resistor depending on the standard of the reader power supplier 316. The circuit 326 for charge extraction is controlled to be turned on or off by a control signal 356 input from the power supply controller 202.

When power is supplied from the reader power supplier 316 to the reader 230, the reader power supplier 316 is controlled to be turned on by the control signal 346, and the circuit 326 for charge extraction is controlled to be turned off by the control signal 356. When no power is supplied from the reader power supplier 316 to the reader 230, the reader power supplier 316 is controlled to be turned off by the control signal 346, and the circuit 326 for charge extraction is controlled to be turned on by the control signal 356. When the circuit 326 for charge extraction is turned on, the wiring line for supplying power from the reader power supplier 316 to the reader 230 is grounded so as to discharge charges.

The printer 240 and the reader 230 have power loads larger than those of other components. Accordingly, the power to be supplied to each of the printer 240 and the reader 230 is generated by the second power supplier 302 different from the first power supplier 301. That is, the power 332 generated by the second power supplier 302 by converting the power 330 supplied from the external power supply 300 is larger than the power 331 generated by the first power supplier 301 by converting the power 330 supplied from the external power supply 300.

The configuration of the power supply system exemplified in FIG. 3 is adopted in a large number of pieces of electronic equipment, and is used for control of supply of power or generation of power depending on the specification of the electronic equipment. Description has been given of a configuration in which the CPU power supplier 310, the image processing power supplier 311, the storage power supplier 312, the network power supplier 313, the operation unit power supplier 314, the printer power supplier 315, and the reader power supplier 316 are independent of each other, but there may be adopted a configuration in which a part thereof is shared. Such a power supply system is applicable also to electronic equipment to be used as an information processing apparatus, such as a personal computer or a server, or electrical equipment, such as an air conditioner or a refrigerator.

In this embodiment, a DC-DC converter is used for generation of power (voltage) performed by the power supply unit 200. For example, the first power supplier 301 and the second power supplier 302 include a DC-DC converter. Further, the power supply unit 200 uses a high-side switch or a load switch for switching ON/OFF of the supply of power. In the following, description is given of a configuration for achieving, on a circuit board, a function of the DC-DC converter by a plurality of components and a configuration for achieving, on a circuit board, a function of the high-side switch or the load switch by a plurality of components.

<Mounting of DC-DC Converter>

As main terminals included in a DC-DC converter semiconductor device (IC), there are an input terminal (VIN), an output terminal (SW: switching), a GND terminal (grounding), and a feedback terminal (FB). It is important that the VIN terminal, the SW terminal, the GND terminal, and the FB terminal be provided at the same terminal positions even among ICs of different types. The reason therefor is because it is required to increase the thickness of the wiring line to be connected to each of those terminals and arrange other elements such as a capacitor near the terminals. The "ICs of different types" refer to ICs having not only the same basic function (in this case, a DC-DC conversion function), but also other different incorporated functions.

For example, a larger amount of current flows through the VIN terminal and the SW terminal as compared to other terminals. Accordingly, the VIN terminal and the SW terminal are required to have a thicker wiring pattern connected thereto, and a capacitor is required to be provided at the vicinity of those terminals in order to reduce switching noise. The FB terminal is a terminal to which a voltage dividing result of an output voltage of the DC-DC converter is to be input. The output voltage is adjusted depending on the voltage dividing result. The FB terminal is required to be connected to a wiring pattern that is unaffected by noise so that an accurate voltage dividing result is input.

The DC-DC converter IC further includes a VBST terminal, a VREG terminal, and an EN terminal. A capacitor for a bootstrap circuit is connected to the VBST terminal. A capacitor for a power supply for driving an internal logic unit is connected to the VREG terminal. An EN_sig signal for output control is input to the EN terminal. Further, in some cases, the DC-DC converter IC includes a terminal for abnormality detection of the output voltage, a terminal for controlling a switching frequency, and the like.

The DC-DC converter IC in this embodiment has eight pins, and includes a ground electrode (GND electrode) as a lower surface electrode. Further, the DC-DC converter IC in this embodiment includes, in addition to the VIN terminal, the SW terminal, the GND terminal, and the FB terminal, the VBST terminal, the VREG terminal, and the EN terminal as common terminals to be used even in an IC of a different type. Some DC-DC converter ICs have different functions for each type. In this embodiment, as the DC-DC converter ICs, an IC having a soft start function and an IC having a power good function are used.

The soft start function is a function for adjusting a rising time of the output voltage of the power supply required until the output voltage of the DC-DC converter reaches a predetermined value. In the soft start function, the time required for the output voltage to reach a predetermined voltage value from when the output is enabled by the EN_sig signal input to the EN terminal is adjusted by a capacitance of an external capacitor. When the soft start function is absent, the output voltage reaches a predetermined voltage value in a fixed time of 1.0 millisecond, 3.0 milliseconds, or the like. The soft start function is used when, for example, time adjustment is to be performed in accordance with a component having a standard regarding the rising time, such as the CPU.

The power good function is a function for giving a notification that an output voltage having a predetermined voltage value has been output. When the power good function is absent, it is required to detect the rising of the output voltage up to the predetermined voltage value through use of a reset IC or the like provided outside of the DC-DC converter IC. The power good function is mainly used for control of a rising order of the output voltage or control of reset cancelation timing.

In this embodiment, the DC-DC converter ICs of different types, which have partially different functions and close shapes as described above, can be mounted on a wiring pattern of a common circuit board. With such a configuration, the change of the procurement situation of the IC can be flexibly coped with while saving space for the circuit board. Further, a part having a different function is achieved by other mounted components.

Figures 4A, 4B:
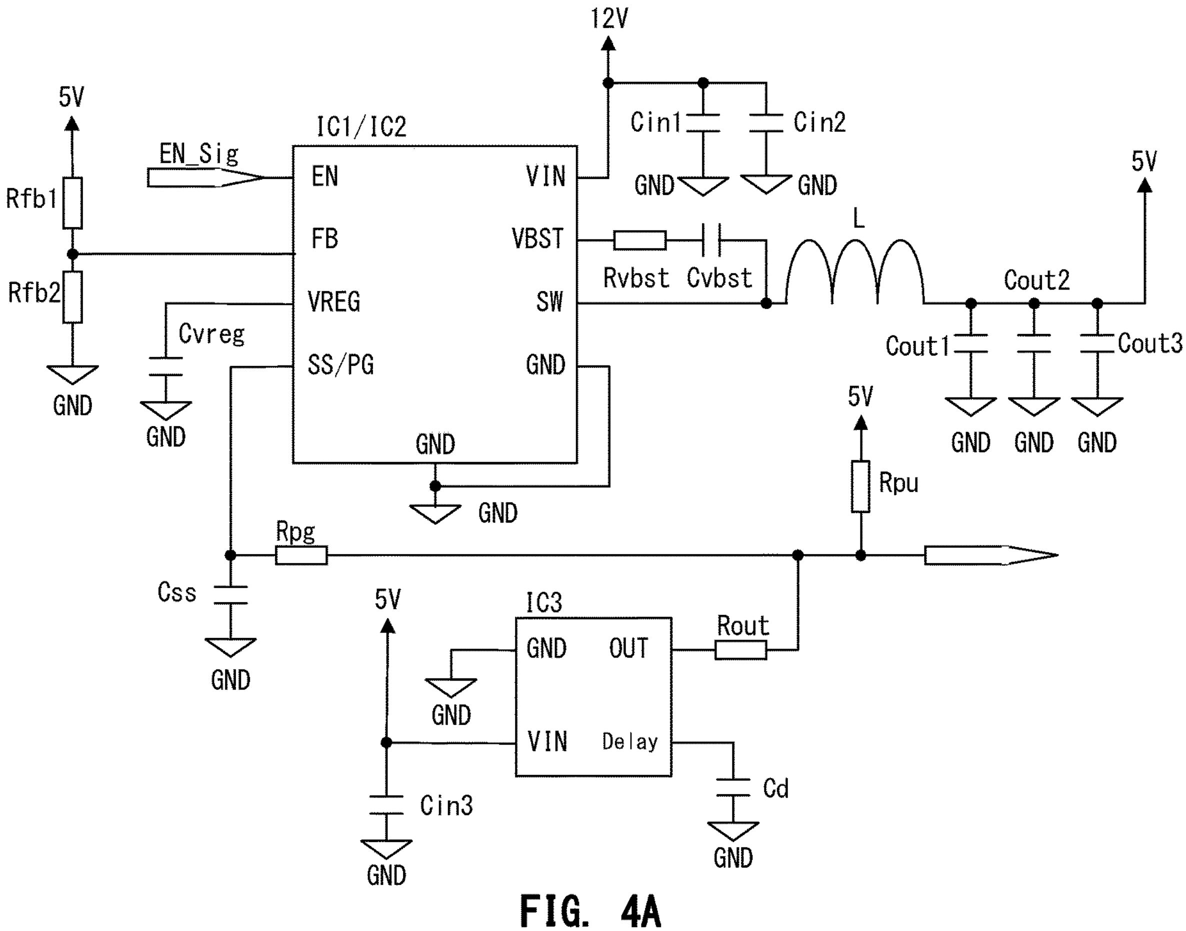
FIG. 4A and FIG. 4B are explanatory diagrams of a circuit board on which a DC-DC converter IC is to be mounted.

FIG. 4A and FIG. 4B are explanatory diagrams of a circuit board on which the DC-DC converter IC is to be mounted. FIG. 4A is a configuration diagram of a circuit on the circuit board. FIG. 4B is an explanatory table of mounted components to be mounted for a normal operation of the DC-DC converter ICs of two different types.

On the circuit board of FIG. 4A, DC-DC converter ICs of different types are to be exclusively mounted. The DC-DC converter ICs which are mountable on the circuit board of this embodiment are IC1 having the soft start function and IC2 having the power good function. Functions of terminals other than the terminals related to those functions are common between IC1 and IC2.

The DC-DC converter is supplied with a power supply voltage from the VIN terminal. In this case, a power supply voltage of 12 V is input. Capacitors Cin1 and Cin2 are connected for noise reduction to a printed wiring line for inputting the power supply voltage. A capacitor Cvbst is connected to the VBST terminal, and a resistor Rvbst for noise reduction is also connected thereto as required.

A smoothing circuit formed of an inductor L and capacitors Cout1 to Cout3 for output smoothing is connected to the SW terminal. An output voltage is output from the SW terminal. The DC-DC converter in this embodiment assumes an output voltage being a DC voltage of 5 V, but 5 V is merely an example. The output voltage may be set to a voltage of 3.3 V, 1.8 V, or the like depending on an electronic component to which the voltage is to be applied. The inductor L belongs to a class having a large size among the components connected to the terminals of the DC-DC converter. The inductor L has a constant determined depending on the characteristic of the DC-DC converter. As the inductor L, in order to use a common circuit board, an inductor having the same size even when the constant is different is required to be selected regardless of the type of the IC.

The GND terminal and the GND electrode which is the lower surface electrode are directly grounded. The EN_sig signal for output control is input to the EN terminal in a case where control of output timing of the output voltage is required. The EN terminal may be connected in pull-up configuration via a resistor to the power supply voltage in a case where the output voltage is output at timing synchronized with the power supply voltage. The FB terminal is connected to a wiring pattern of the output voltage. A voltage obtained by dividing the output voltage by resistors of a resistor Rfb1 and a resistor Rfb2 is applied to the FB terminal. Resistance values of the resistor Rfb1 and the resistor Rfb2 are selected in accordance with the voltage desired to be output because a reference voltage for controlling ON/OFF of the SW terminal is defined. Values of the resistor Rfb1 and the resistor Rfb2 are changed depending on the setting voltage of the FB terminal. A capacitor Cvreg is connected to the VREG terminal.

Depending on whether the function incorporated in the IC is the soft start function (SS) or the power good function (PG), a capacitor Css and a resistor Rpg are exclusively mounted on the circuit board. An SS/PG terminal represents an SS terminal in a case of IC1 having the soft start function, and represents a PG terminal in a case of IC2 having the power good function.

When IC1 having the soft start function (SS) is mounted on the circuit board, the capacitor Css is connected to the SS terminal. When IC1 is mounted, the resistor Rpg is not mounted. A capacitance value of the capacitor Css is selected in accordance with the rising time of the output voltage of the DC-DC converter (IC2) of another type. In this manner, the rising time of the output voltage can be matched between IC1 and IC2. Further, in order to externally compensate for the function of the resistor Rpg which is unmounted in a case where IC1 is mounted, IC3 which is a reset IC and a peripheral circuit thereof (capacitors Cin3 and Cd and resistor Rout) are mounted on the circuit board. Assuming open drain output, a resistor Rpu is mounted on the circuit board as the pull-up for the output voltage of 5 V, but a CMOS output product may be used instead.

When IC2 having the power good function (PG) is mounted on the circuit board, the resistor Rpg is connected to the PG terminal. When IC2 is mounted, the capacitor Css is not mounted. As for open drain output, the resistor Rpu is mounted on the circuit board as the pull-up for the output voltage of 5 V.

With reference to FIG. 4B, description is given of mounted components to be mounted on the circuit board in a case where each of the DC-DC converter IC1 and the DC-DC converter IC2 of two types is mounted. When IC1 is mounted, the capacitor Css, IC3, the capacitor Cin3, the capacitor Cd, and the resistor Rout are mounted, but the resistor Rpg is not mounted. When IC2 is mounted, the resistor Rpg is mounted, but the capacitor Css, IC3, the capacitor Cin3, the capacitor Cd, and the resistor Rout are not mounted.

Those mounted components are components for compensating for the function that is different between IC1 and IC2. Accordingly, this circuit board can use any one of IC1 or IC2 as a replacement component. The circuit board is provided on the control unit 201, the reader 230, or the printer 240. No matter which of IC1 or IC2 is mounted on the circuit board, the function of the control unit 201, the reader 230, or the printer 240 does not change.

Figure 5A:
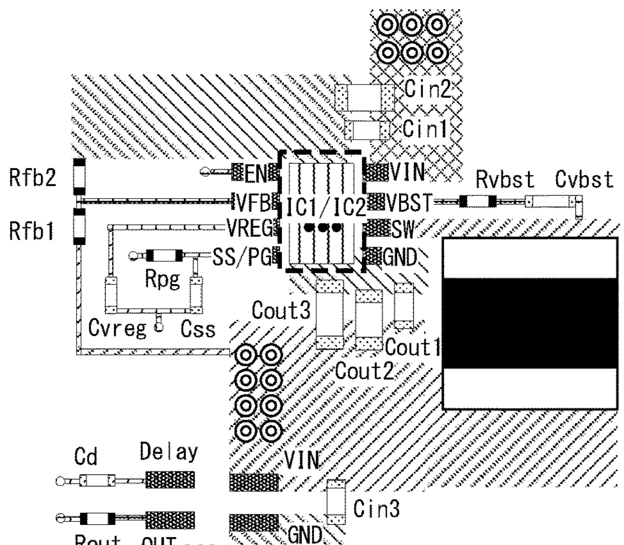
FIG. 5A, FIG. 5B, and FIG. 5C are exemplary views of circuit layouts of the circuit board of FIG. 4A and FIG. 4B.
Figure 5B:
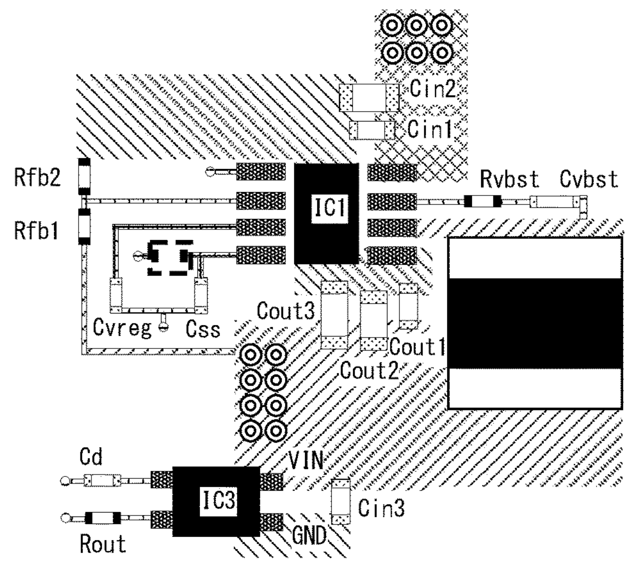
Figure 5C:
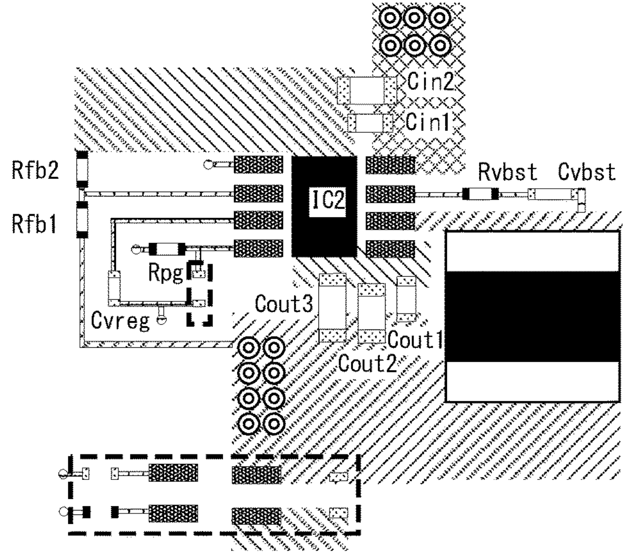

FIG. 5A to FIG. 5C are exemplary views of circuit layouts of the circuit board of FIG. 4A. FIG. 5A exemplifies a wiring pattern of the circuit board on which the DC-DC converter IC is to be mounted. FIG. 5B exemplifies a circuit board obtained in a case where IC1 is mounted. FIG. 5C exemplifies a circuit board obtained in a case where IC2 is mounted. The frame line indicated by the broken line of FIG. 5B and FIG. 5C indicates a region in which an unmounted component is to be mounted.

As illustrated in FIG. 5A, on the circuit board, a wiring pattern is formed so that IC1 and IC2 can be mounted at the same position (land), and common components other than function differential components are mounted on the circuit board. A mounting region of IC3 which is the reset IC is arranged near a region in which IC1 and IC2 are to be mounted. The mounting region of IC3 is arranged near a mounting position of IC1 and IC2 in order to prevent wiring patterns, such as a power supply pattern, a signal pattern, and a signal branching pattern, from being unnecessarily elongated. Further, the mounting region of IC3 may be provided on a surface opposite to the surface on which IC1 and IC2 are to be mounted.

It is assumed that the EN terminal, the SS/PG terminal, and the like are connected to the wiring pattern via vias of the circuit board. In this case, a circuit to be connected to the SS/PG terminal is mounted on the surface of the circuit board on the opposite side of the surface on which the DC-DC converter IC is to be mounted. That is, the mounting region of the component for compensating for the function that is different between IC1 and IC2 is provided on the surface on the opposite side of the surface on which the DC-DC converter IC is to be mounted. As long as connection is made in accordance with the circuit diagram of FIG. 4A, the connection is not particularly specified, and hence a detailed description using the drawings is omitted.

When the DC-DC converter ICs having different functions are mounted as described above, a difference in function is compensated for by an external circuit. The external circuit is formed of a plurality of components, and the mounted components to be actually used are changed depending on the type of the IC to be mounted. Accordingly, a circuit board capable of flexibly coping with the change of the procurement situation of the component can be obtained while saving space.

<Mounting of High-Side Switch and Load Switch>

In this embodiment, the functions of the high-side switch and the load switch are achieved not only by an IC, but also by a plurality of components including the IC mounted on the circuit board. The high-side switch and the load switch are hereinafter simply referred to as "power switch."

As main terminals included in a power switch semiconductor device (IC), there are an input terminal (VIN), an output terminal (VOUT), and a GND terminal (grounding). It is important that the VIN terminal, the VOUT terminal, and the GND terminal be provided at the same terminal positions even among ICs of different types. The reason therefor is because a larger amount of current flows through those terminals as compared to other terminals, and hence it is required to increase the thickness of the wiring line to be connected to each of those terminals. The "ICs of different types" refer to ICs having not only the same basic function (in this case, a function of a power switch), but also other different incorporated functions.

The power switch IC further includes an ILIM terminal, an EN terminal, and the like. A resistor for current limitation is connected to the ILIM terminal. An EN_sig2 signal for output control is input to the EN terminal. The power switch IC in this embodiment has six pins, and includes the VIN terminal, the VOUT terminal, the GND terminal, the ILIM terminal, and the EN terminal as common terminals to be used even in an IC of a different type. Some high-side switch ICs and load switch ICs in this embodiment have different functions. In this embodiment, as the power switch ICs, an IC having an error detection function, an IC having a soft start function, and an IC having a discharge function are used.

The soft start function is a function for adjusting a rising time of the power supply required until the output voltage of the power switch reaches a predetermined value. In the soft start function, the time required for the output voltage to reach a predetermined voltage value from when the output is enabled by the EN_sig2 signal input to the EN terminal is adjusted by a capacitance of an external capacitor. When the soft start function is absent, the output voltage reaches a predetermined voltage value in a fixed time of 1.0 millisecond, 3.0 milliseconds, or the like. The soft start function is used when, for example, time adjustment is to be performed in accordance with a component having a standard regarding the rising time, such as the CPU.

The error detection function is a function for giving a notification that an output voltage having a predetermined voltage value cannot be output for reasons such as overcurrent. When the error detection function is absent, it is required to detect the reduction of the output voltage through use of an externally provided reset IC or the like. This embodiment assumes a case of voltage reduction of the output voltage as the content of the error detection, and employs a configuration in which the output voltage is monitored by a reset IC.

The discharge function is a function for discharging charges stored in the terminal so that the output voltage is reduced within a predetermined time period when the power is turned off. When the discharge function is absent, a field effect transistor (FET) or the like is used as an external discharge element.

In this embodiment, the power switch ICs of different types, which have partially different functions and close shapes as described above, can be mounted on a wiring pattern of a common circuit board. With such a configuration, the change of the procurement situation of the IC can be flexibly coped with while saving space for the circuit board. Further, a part having a different function is achieved by other mounted components.

FIG. 6A and FIG. 6B are explanatory diagrams of a circuit board on which the power switch IC is to be mounted. FIG. 6A is a configuration diagram of a circuit on the circuit board. FIG. 6B is an explanatory table of mounted components to be mounted for a normal operation of the power switch ICs of three types.

On the circuit board of FIG. 6A, power switch ICs of different types are to be exclusively mounted. The power switch ICs which are mountable on the circuit board of this embodiment are IC4 being a high-side switch having the error detection function, IC5 being a load switch having the soft start function, and IC6 being a load switch having the discharge function. Functions of terminals other than the terminals related to those functions are common among IC4, IC5, and IC6.

The power switch is supplied with a power supply voltage from the VIN terminal. In this case, a power supply voltage of 5 V is input. A capacitor Cin4 is connected for noise reduction to a printed wiring line for inputting the power supply voltage. A capacitor Cout4 is connected to a printed wiring line connected to the VOUT terminal for outputting the output voltage. The power switch in this embodiment assumes an output voltage being a DC voltage of 5 V (in order to distinguish this output voltage from the output of the DC-DC converter, the output voltage is expressed as "5 V_B"). This output voltage 5 V_B is merely an example, and the output voltage may be set to a voltage of 3.3 V, 1.8 V, or the like depending on an electronic component to which the voltage is to be applied.

The GND terminal is directly grounded to the GND electrode. The EN_sig2 signal for output control is input to the EN terminal in a case where control of output timing of the output voltage is required. The EN terminal may be connected in pull-up configuration via a resistor to the power supply voltage in a case where the output voltage is output at timing synchronized with the power supply voltage. The ILIM terminal is grounded via a resistor Rilim. A resistance value of the resistor Rilim for current limitation varies depending on the type of the power switch, and is determined depending on the current value desired to be set. Some power switches have no overcurrent protection function. In this case, a protection component such as a fuse may be arranged at any of the input or the output.

Depending on the function incorporated in the IC, resistors Rerr, Rdis, Rpu3, Rpu4, and Rout2, capacitors Css2, Cin5, and Cd2, transistors Q3 and Q4, and IC7 which is a reset IC are exclusively mounted. An ERR/SS/DIS terminal represents an ERR terminal in a case of IC4 being the high-side switch having the error detection function, represents an SS terminal in a case of IC5 being the load switch having the soft start function, and represents a DIS terminal in a case of IC6 being the load switch having the discharge function.

When IC4 having the error detection function is mounted on the circuit board, the resistor Rerr and the resistor Rpu2 are connected to the ERR terminal. When IC4 is mounted, in order to externally compensate for the discharge function, the transistors Q3 and Q4 and the resistors Rpu3 and Rpu4 are mounted on the circuit board.

When IC5 having the soft start function is mounted on the circuit board, the capacitor Css2 is connected to the SS terminal. The capacitor Css2 has a constant selected in accordance with the rising time of the output voltage of the power switch (IC4 or IC6) of another type. In this manner, even in a case where IC5 is mounted, the rising time of the output voltage can be matched with the rising time of the output voltage of the another IC of IC4 or IC6.

When IC5 is mounted on the circuit board, in order to externally compensate for the discharge function, the transistors Q3 and Q4 and the resistors Rpu3 and Rpu4 are mounted on the circuit board. Further, in order to externally compensate for the error detection function, IC7 which is a reset IC and a peripheral circuit thereof (capacitors Cin5 and Cd2 and resistor Rout2) are mounted on the circuit board. Assuming open drain output, a pull-up resistor for the output voltage of 5V_B is mounted on the circuit board, but a CMOS output product may be used instead.

When IC6 having the discharge function is mounted on the circuit board, the resistor Rdis is connected to the DIS terminal. When IC6 is mounted, in order to externally compensate for the error detection function, IC7 which is a reset IC and a peripheral circuit thereof (capacitors Cin5 and Cd2 and resistor Rout2) are mounted on the circuit board. Assuming open drain output, a pull-up resistor for the output voltage of 5 V_B is mounted on the circuit board, but a CMOS output product may be used instead.

With reference to FIG. 6B, description is given of mounted components to be mounted on the circuit board in a case where each of the power switches IC4, IC5, and IC6 of three types is mounted. When IC4 is mounted, the resistors Rerr, Rpu3, and Rpu4 and the transistors Q3 and Q4 are mounted, but the resistors Rdis and Rout2, the capacitors Css2, Cin5, and Cd2, and IC7 are not mounted. When IC5 is mounted, the resistors Rpu3, Rpu4, and Rout2, the capacitors Css2, Cin5, and Cd2, the transistors Q3 and Q4, and IC7 are mounted, but the resistors Rerr and Rdis are not mounted. When IC6 is mounted, the resistors Rdis and Rout2, the capacitors Cin5 and Cd2, and IC7 are mounted, but the resistors Rerr, Rpu3, and Rpu4, the capacitor Css2, and the transistors Q3 and Q4 are not mounted.

Those mounted components are components for compensating for the function that is different among IC4, IC5, and IC6. Accordingly, this circuit board can use any one of IC4, IC5, or IC6 as a replacement component. The circuit board is provided on the control unit 201, the reader 230, or the printer 240. No matter which of IC4, IC5, or IC6 is mounted on the circuit board, the function of the control unit 201, the reader 230, or the printer 240 does not change.

FIG. 7A to FIG. 7D are exemplary views of circuit layouts of the circuit board of FIG. 6A. FIG. 7A exemplifies a wiring pattern of the circuit board on which the power switch IC is to be mounted. FIG. 7B exemplifies a circuit board obtained in a case where IC4 is mounted. FIG. 7C exemplifies a circuit board obtained in a case where IC5 is mounted. FIG. 7D exemplifies a circuit board obtained in a case where IC6 is mounted. The frame line indicated by the broken line of FIG. 7B, FIG. 7C, and FIG. 7D indicates a region in which an unmounted component is to be mounted.

As illustrated in FIG. 7A, on the circuit board, a wiring pattern is formed so that IC4, IC5, and IC6 can be mounted at the same position (land), and common components other than function differential components are mounted on the circuit board. IC7 which is a reset IC and the transistors Q3 and Q4 are arranged near a region in which IC4, IC5, and IC6 are to be mounted. Mounting positions of IC7 and the transistors Q3 and Q4 are arranged near a mounting position of IC4, IC5, and IC6 in order to prevent wiring patterns, such as a power supply pattern, a signal pattern, or a signal branching pattern, from being unnecessarily elongated. Further, mounting regions of IC7 and the transistors Q3 and Q4 may be provided on a surface opposite to the surface on which IC4, IC5, and IC6 are to be mounted.

It is assumed that the EN terminal, the ERR/SS/DIS terminal for outputting an error detection result, and the like are connected to the wiring pattern via vias of the circuit board. In this case, a circuit to be connected to the ERR/SS/DIS terminal is mounted on the surface of the circuit board on the opposite side of the surface on which the power switch IC is to be mounted. That is, the mounting region of the component for compensating for the function that is different among IC4, IC5, and IC6 is provided on the surface on the opposite side of the surface on which the power switch IC is to be mounted. As long as connection is made in accordance with the circuit diagram of FIG. 6A, the connection is not particularly specified, and hence a detailed description using the drawings is omitted.

When the power switch ICs having different functions are mounted as described above, a difference in function is compensated for by an external circuit. The external circuit is formed of a plurality of components, and the mounted components to be actually used are changed depending on the type of the IC to be mounted. Accordingly, a circuit board capable of flexibly coping with the change of the procurement situation of the component can be obtained while saving space.

As described above, even when a function that is different among semiconductor devices of different types is compensated for by a plurality of components, the circuit board can be downsized.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-154442, filed Sep. 28, 2022, which is hereby incorporated by reference herein in its entirety.

What is claimed is:

1. A circuit board on which a first semiconductor device or a second semiconductor device which is different from the first semiconductor device is exclusively mounted, wherein the circuit board comprises a region in which a component configured to form a circuit for achieving a function incorporated in the first semiconductor device but not incorporated in the second semiconductor device is to be mounted, and wherein the component is prevented from being mounted in the region in a case where the first semiconductor device is mounted, and the component is mounted in the region in a case where the second semiconductor device is mounted.

2. The circuit board according to claim 1, wherein the first semiconductor device and the second semiconductor device each include a common terminal to be arranged at the same position so as to achieve the same function, and wherein the circuit board further comprises a wiring line to be connected to the common terminal no matter which of the first semiconductor device or the second semiconductor device is mounted on the circuit board.

3. The circuit board according to claim 2, wherein the first semiconductor device and the second semiconductor device each include an input terminal to be arranged at the same position, and an output terminal to be arranged at the same position, and wherein the circuit board further comprises a wiring line to be connected to the input terminal and a wiring line to be connected to the output terminal no matter which of the first semiconductor device or the second semiconductor device is mounted on the circuit board.

4. The circuit board according to claim 1, wherein the first semiconductor device and the second semiconductor device are each a semiconductor device to be used as a power supply, wherein the first semiconductor device has a power good function, but the second semiconductor device does not have the power good function, and wherein, in a case where the second semiconductor device is mounted on the circuit board, the component configured to form a circuit for exhibiting the power good function is mounted in the region.

5. The circuit board according to claim 1, wherein the first semiconductor device and the second semiconductor device are each a semiconductor device to be used as a power supply, wherein the first semiconductor device has a soft start function, but the second semiconductor device does not have the soft start function, and wherein, in a case where the second semiconductor device is mounted on the circuit board, the component configured to form a circuit for exhibiting the soft start function is mounted in the region.

6. The circuit board according to claim 1, wherein the first semiconductor device and the second semiconductor device are each a semiconductor device to be used as a power supply, wherein the first semiconductor device has an error detection function, but the second semiconductor device does not have the error detection function, and wherein, in a case where the second semiconductor device is mounted on the circuit board, the component configured to form a circuit for exhibiting the error detection function is mounted in the region.

7. The circuit board according to claim 1, wherein the first semiconductor device and the second semiconductor device are each a semiconductor device to be used as a power supply, wherein the first semiconductor device has a discharge function, but the second semiconductor device does not have the discharge function, and wherein, in a case where the second semiconductor device is mounted on the circuit board, the component configured to form a circuit for exhibiting the discharge function is mounted in the region.

8. An image forming apparatus comprising:

a constituent component for use in forming an image; and a circuit board which is connected to the constituent component, and on which a first semiconductor device or a second semiconductor device which is different from the first semiconductor device is exclusively mounted, wherein the circuit board includes a region in which a component configured to form a circuit for achieving a function incorporated in the first semiconductor device but not incorporated in the second semiconductor device is to be mounted, and wherein the component is prevented from being mounted in the region in a case where the first semiconductor device is mounted, and the component is mounted in the region in a case where the second semiconductor device is mounted.

9. The image forming apparatus according to claim 8, wherein the first semiconductor device and the second semiconductor device are each a semiconductor device to be used as a power supply, and wherein the circuit board is configured to supply power to the constituent component.

10. A mounting method onto a circuit board on which a first semiconductor device or a second semiconductor device which is different from the first semiconductor device is exclusively mountable, the circuit board having a region in which a component for use in achieving a function incorporated in the first semiconductor device but not incorporated in the second semiconductor device is to be mounted, the mounting method comprising preventing the component from being mounted in the region in a case where the first semiconductor device is mounted, and mounting the component in the region in a case where the second semiconductor device is mounted.

* * * * *